(12) United States Patent
Silverstein et al.

(10) Patent No.: US 8,038,316 B2
(45) Date of Patent: Oct. 18, 2011

(54) 3-D COLOR SYNTHESIS DISPLAYS AND METHODS

(75) Inventors: Louis D. Silverstein, Scottsdale, AZ (US); Cecil W. Penn, Scottsdale, AZ (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 478 days.

(21) Appl. No.: 11/910,241

(22) PCT Filed: Apr. 3, 2006

(86) PCT No.: PCT/CA2006/000511
§ 371 (c)(1),
(2), (4) Date: Jan. 7, 2008

(87) PCT Pub. No.: WO2006/102769
PCT Pub. Date: Oct. 5, 2006

(65) Prior Publication Data
US 2009/0141488 A1 Jun. 4, 2009

Related U.S. Application Data

(60) Provisional application No. 60/667,506, filed on Apr. 1, 2005.

(51) Int. Cl.
*F21V 9/16* (2006.01)
(52) U.S. Cl. .......... 362/231; 362/84; 362/561; 362/97.2; 362/97.3
(58) Field of Classification Search .................. 362/231, 362/561, 97.2, 97.3; 313/512, 498, 504–506; 359/242, 237, 464; 349/78–80; 345/4–6, 345/418, 591; 348/60; 353/7, 84, 94
See application file for complete search history.

(56) References Cited

U.S. PATENT DOCUMENTS

| 5,315,418 A | 5/1994 | Sprague |
| 5,642,125 A | 6/1997 | Silverstein |
| 6,911,772 B2 | 6/2005 | Cok |
| 7,142,179 B2 | 11/2006 | Miller et al. |
| 7,250,722 B2 | 7/2007 | Cok et al. |

FOREIGN PATENT DOCUMENTS

WO  WO 96/19792 A2  6/1996

*Primary Examiner* — Sharon Payne

(57) ABSTRACT

Color displays superpose a two color image component with a monochrome image component to yield full color images. Each image component may be generated by controlling an array of light sources. In some embodiments the monochrome image component is provided by a backlight and the two color component is provided by an array of sub-pixels of two types.

34 Claims, 20 Drawing Sheets

| R | G | B | R | G | B |
|---|---|---|---|---|---|
| R | G | B | R | G | B |
| R | G | B | R | G | B |
| R | G | B | R | G | B |
| R | G | B | R | G | B |
| R | G | B | R | G | B |

FIGURE 5A

| R | G | B | R | G | B |
|---|---|---|---|---|---|
| B | R | G | B | R | G |
| G | B | R | G | B | R |
| R | G | B | R | G | B |
| B | R | G | B | R | G |
| G | B | R | G | B | R |

FIGURE 5B

| R | G | R | G | R | G |
|---|---|---|---|---|---|
| G | B | G | B | G | B |
| R | G | R | G | R | G |
| G | B | G | B | G | B |
| R | G | R | G | R | G |
| G | B | G | B | G | B |

Vertical Stripe Mosaic
-Sampling Density R=G=B
- $\Delta Y = 3 \Delta X$

3-D COLOR SYNTHESIS DISPLAYS AND METHODS

REFERENCE TO RELATED APPLICATION

This application claims Paris Convention priority from U.S. Patent Application No. 60/667,506 filed 1 Apr. 2005. For purposes of the United States of America, this application claims the benefit under 35 U.S.C. §119 of U.S. Patent Application No. 60/667,506 filed 1 Apr. 2005 and entitled THREE-DIMENSIONAL COLOR SYNTHESIS FOR ENHANCED DISPLAY IMAGE QUALITY which is hereby incorporated herein by reference in its entirety.

TECHNICAL FIELD

This invention relates to electronic information displays. The invention may be embodied, for example, in: direct-view, flat-panel type color matrix display devices; projection display systems; or near-to-eye, color imaging devices in which one or more devices composed of a matrix of discretely-addressable picture elements serve as image-forming components.

BACKGROUND

Color matrix display (CMD) devices, in which a discretely-addressable two-dimensional matrix of picture elements (pixels) is used to create a full-color image are rapidly becoming the dominant technology for both information display and television (TV) applications. Some color matrix displays, such as multi-color organic light emitting diode (OLED) matrix displays and matrix-addressed electroluminescent (EL) panels are self-luminous. Other color matrix displays, such as matrix-addressed liquid crystal displays (LCDs), are not self-luminous. A device, such as an LCD matrix, that is not self-luminous may be called a "light valve".

Synthesizing full-color images from a limited set of primary colors is a common problem for all CMDs. The trichromatic theory of color vision underlies color synthesis. This theory postulates that all colors are analyzed by the human visual system (HVS) through three different types of response, which correspond to the transformed spectral sensitivities of three different populations of photosensitive receptors in the human retina. Each receptor population is selectively sensitive to optical radiation within a finite spectral bandwidth that approximates separate long-(red), middle-(green) and short-(blue) wavelength response functions. These three response functions are neurally processed and combined in a complex manner to produce what we ultimately experience as color.

According to the trichromatic theory, because the outputs of only three distinct populations of wavelength-sensitive receptors are combined to produce our sensation of the entire spectrum of colors, the appearance of any color can be matched by mixing three appropriately-selected primary color stimuli.

Conceptually, the simplest form of additivity involves directly superimposing three differently-colored beams of light or colored images. Some full-color electronic displays combine light from primary-colored luminous sources. For example, some projection displays designed for group viewing superpose three projected primary-color images. The optical systems for such projection displays tend to be large and cumbersome. Precise alignment of the three projected images is often difficult to achieve. Moreover, most displays of this type tend to be low in luminance.

Direct-view displays that attempt to superimpose three primary-color images have the added problem that manufacturing yields and device reliability can be undesirably low in devices that require fabrication and alignment of three independently-addressable primary color pixel arrays. This raises manufacturing costs. Further, direct-view displays which utilize spatial superposition are prone to viewing parallax at off-axis observation angles. Viewing parallax results in the perceptible misregistration of the three primary color pixel arrays and becomes increasingly apparent as the pixel dimensions relative to the thickness of the individual color pixel arrays decreases (e.g. high-resolution color displays) and/or the off-axis observation angle is increased.

Some displays exploit the fact that the HVS is quite limited in both spatial and temporal resolution. Integration occurs beyond the spatial and temporal resolution limits of the HVS. Therefore, spatial or temporal patterns composed of three appropriately-selected primary colors are sufficient for producing a full range of colors when the spatial or temporal frequencies of the patterns exceed the respective resolution limits. This permits spatial-additive and temporal-additive color synthesis (see Wandell & Silverstein, *Digital color reproduction* in S. Shevell (ed.) *The science of color*, $2^{nd}$ edition, Optical Society of America, Washington D.C. (2003) pp. 281-316 for coverage of both the basics of color vision and color synthesis in imaging systems).

The HVS can be modeled as having a channel structure in which luminance and chromatic channels are separable. FIG. 1 provides a schematic representation of the opponent-process visual channels from the retinal photoreceptors through the early neural processing stages. The low-level visual channels are organized into two opponent chromatic channels, a R-G channel and a yellow Y-B channel, and a luminance channel formed by the sum of R and G photoreceptor outputs. In this representation the short-wavelength or B photoreceptors do not contribute to the luminance channel. FIG. 2 shows the photopic luminous efficiency function of the HVS and further illustrates the very small contribution of short wavelengths to image luminance.

FIG. 3 shows results from psychophysical investigations of the resolution of the luminance (intensity) and chromatic visual channels (R-G and Y-B) of the HVS. It is clear from these data that the luminance or intensity channel is responsible for most of the spatial resolving capability of the HVS. The chromatic channels, and particularly the short-wavelength or B input, manifest dramatically reduced spatial resolution relative to the luminance or intensity channels.

The temporal resolution limits of the HVS manifest a similar separability of luminance and chromatic visual channels. FIG. 4 shows the results of Varner *Temporal sensitivities related to color theory*, Journal of the Optical Society of America A (1984) pp. 474-481 which examined the temporal contrast sensitivity functions for temporal modulations in luminance and chromaticity. Temporal resolution is much higher for time varying modulations of luminance than for chromaticity. Thus, it is clear that temporal sequences of different chromaticity or color imaged on the same region of the retina integrate to produce a mixture color. Such temporal integration takes place even at low to moderate temporal frequencies.

Patterns of spatially separate image points of different color, if small enough and viewed from a sufficient distance, cannot be individually resolved by the HVS and integrate spatially to produce a color which is equivalent to a mixture of the image points within a small projected region of the retina. The color produced by spatial synthesis is effectively the same as that produced by direct superposition.

X-Y spatial-additive color synthesis has by far been the most successful method for producing multi-color displays and is exemplified by the shadow-mask color CRT and the color liquid crystal display (LCD). A common feature of such devices is the X-Y spatial mosaic of color primary elements. Most color pixel mosaics consist of a repetitive geometric pattern of R, G and B sub-pixel elements, although some mosaics with an additional fourth color, such as white (W) or yellow (Y), exist for specific applications.

Self-luminous devices of this type require separate emitters which each produce light in one of the wavelength bands of the primary colors. These separate emitters are arranged to produce the color matrix pixel pattern. In non-self-luminous devices, such as matrix-addressed LCDs, a color filter array is imposed over the matrix of individual light valves and aligned such as to produce a mosaic of color pixels.

Many color pixel mosaics can be used. These include:
the RGB vertical stripe mosaic (see FIG. 5A),
the RGB diagonal stripe mosaic (see FIG. 5B),
the RGBG quad mosaic (also called the Bayer filter pattern) (see FIG. 5C),
the RGB delta-triad mosaic (see FIG. 5D),
the RGBW quad mosaic, and
the RGBY quad mosaic.

FIGS. 6A through 6C, and FIGS. 6D through 6F show the mosaic pattern, associated spatial Nyquist limits and associated fixed-pattern noise modulation spectra of the RGB vertical stripe and RGB delta-triad mosaics, respectively. The spatial Nyquist limits define a two-dimensional spatial frequency baseband which indicate the maximum spatial frequencies which can be rendered with a color pixel mosaic without aliasing artifacts. This is an effective descriptor of the resolution of the mosaic. The fixed-pattern noise modulation spectra indicate the residual luminance modulation as a function of spatial frequency which is produced by the mosaic when rendering a white flat-field image (i.e., all of the color sub-pixels are activated). Thus, this is an effective descriptor of visual noise contributed by the color pixel mosaic itself. A comparison of FIGS. 6B and 6E shows that the resolution of the RGB delta-triad mosaic is substantially higher than that for the RGB stripe mosaic as evidenced by the larger baseband; and the fixed-pattern noise contributed by the RGB delta-triad mosaic is much lower than that produced by the RGB stripe mosaic as evidenced by the higher spatial frequencies and lower modulation values for the RGB delta-triad mosaic.

The color pixel mosaic, the addressing algorithm which maps image content to the matrix of primary color sub-pixels, and HVS characteristics interact in a complex manner to determine overall CMD image quality. Although X-Y spatial-additive color synthesis has been an extremely successful approach for generating full-color images X-Y spatial additive color synthesis sacrifices display resolution. The use of an RGB pixel mosaic consumes three sub-pixels for each full-color image pixel. This reduces the spatial imaging potential of the display. While optimized pixel addressing algorithms and image processing methods can somewhat reduce the impact of this loss of spatial resolution on image quality, the trade-off between spatial resolution and color is a significant limiting factor.

Another limiting factor of X-Y spatial-additive color synthesis is the fixed-pattern noise produced by the mosaic of primary color sub-pixels. This modulation arises due to the differing luminous proportions of the primary color sub-pixels required to produce specified mixture colors such as a balanced white. In general the B sub-pixel is the largest contributor to the fixed-pattern noise of color pixel mosaics as short-wavelengths contribute little to luminance, and the luminance required of B sub-pixel elements is low compared to the surrounding R and G elements for most mixture colors. The level of fixed-pattern noise is dependent upon the particular geometry of the various color pixel mosaics and varies as a function of spatial frequency.

Temporal color synthesis, or field-sequential color can be used to generate full-color imagery without the loss of spatial resolution. Field-sequential color has been employed in projection display systems. There is also a long history of attempts to use the field-sequential color approach for synthesizing full-color images in TV and information displays. Despite these persistent attempts at commercialization, field-sequential color display technology met with only marginal success until advances in display electrical and optical components made it practical to make cost effective systems with sufficient temporal bandwidth and optical efficiency to be commercially successful.

Two limitations of temporal color synthesis are that: residual luminance differences between the time-varying color components can produce observable luminance flicker for temporal frequencies at or beyond those at which effective chromatic integration has taken place; and temporal synthesis assumes that the time-varying color components are imaged on the same region of the retina, an assumption which is often violated in the presence of head and eye movements. Eliminating flicker in a field-sequential color display utilizing R, G and B color fields generally requires a high field rate. This substantially increases the temporal bandwidth requirements of the display system.

Relative movement between the displayed image and the retina of the display observer is harder to correct for. This relative movement may arise either as a result of dynamic motion of the image or head and eye movements of the observer. In either case the result is that the time-varying color components are no longer imaged on the same region of the retina and the observer experiences "color break-up."

Silverstein et al., U.S. Pat. No. 5,642,125 and Sprague et al., U.S. Pat. No. 5,315,418, disclose color displays which combine a red-green image component with a blue image component to yield color images.

There is a need for improved color display technology.

SUMMARY

The following embodiments and aspects thereof are described and illustrated in conjunction with systems, tools and methods which are meant to be exemplary and illustrative, not limiting in scope.

One aspect of the invention provides color displays which comprise first and second planes. The first plane comprises an array of individually-addressable first light emitters. The first light emitters are each capable of emitting light having a first spectral power distribution. The second plane comprises an array of individually-addressable second light emitters and individually-addressable third light emitters. The second light emitters are each capable of emitting light having a second spectral power distribution. The third light emitters are each capable of emitting light having a third spectral power distribution. The second plane is substantially adjacent to and parallel to the first plane. The first, second and third spectral power distributions are different from one another and either the second plane is substantially transparent to light emitted by the first plane or the first plane is substantially transparent to light emitted by the second plane.

Further aspects of the invention and features of various embodiments of the invention are described below.

BRIEF DESCRIPTION OF THE DRAWINGS

The invention will be described in detail with reference to the following non-limiting drawings wherein:

FIGS. 5A to 5D show prior art CMD pixel mosaics;

DESCRIPTION

Figure 1:
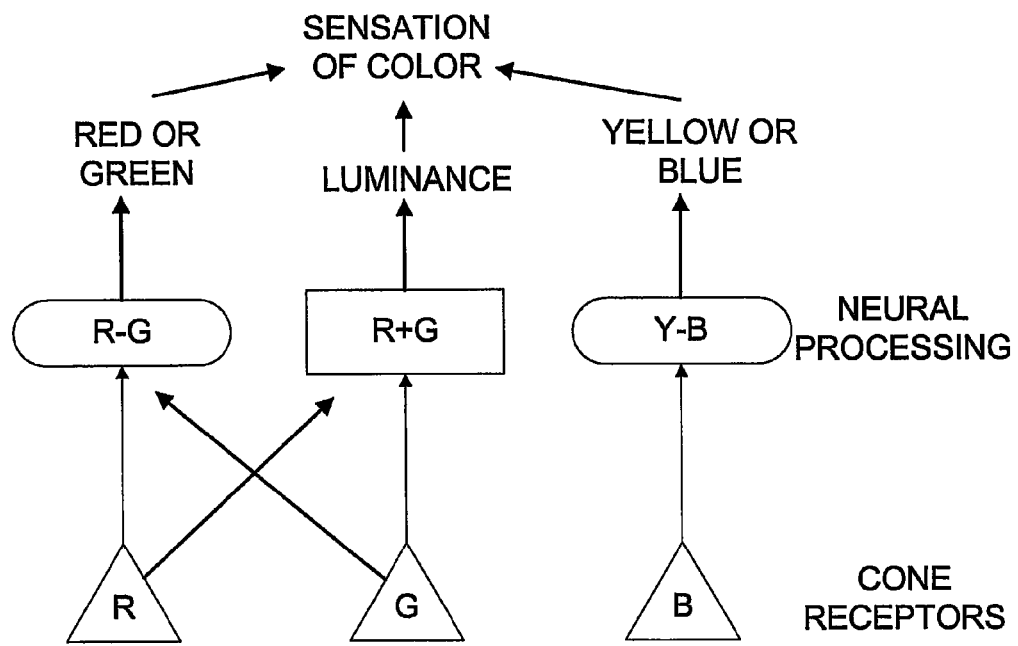
FIG. 1 is a schematic representation of opponent-process visual channels in a representation of the HVS.
Figure 2:
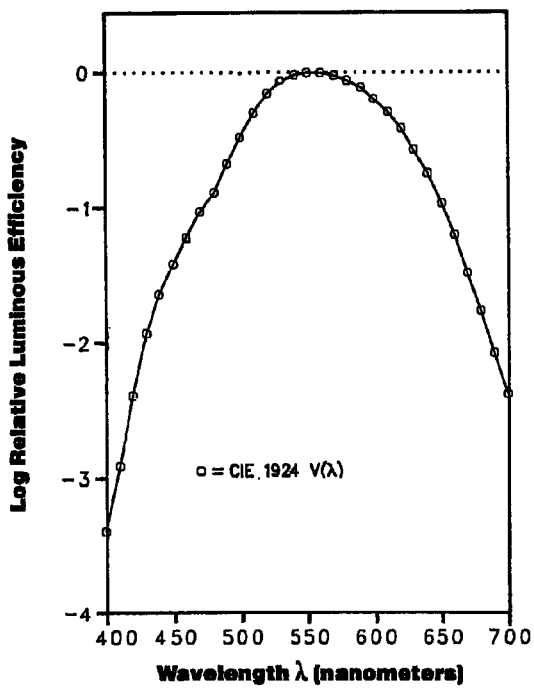
FIG. 2 is a graph showing the photopic luminous efficiency of the HVS as a function of wavelength.
Figure 3:
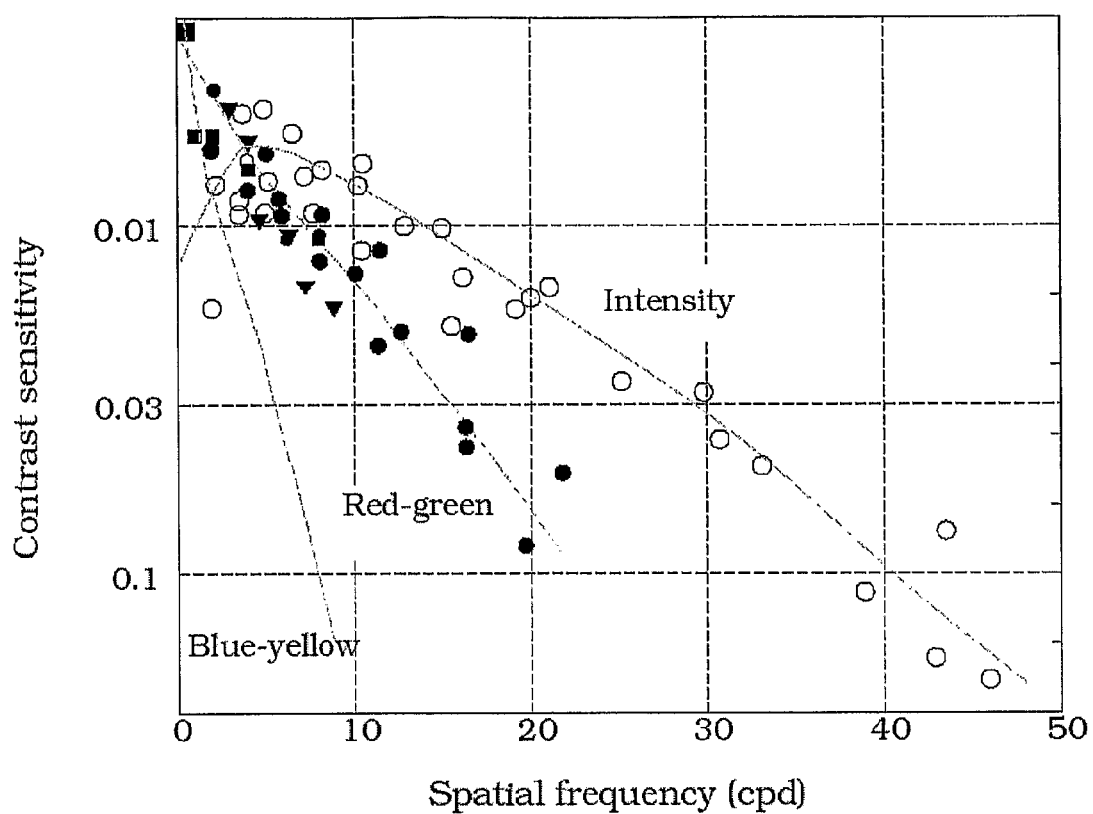
FIG. 3 is a graph illustrating the resolution of the luminance (intensity) and color channels (red-green, blue-yellow) of the HVS.
Figure 4:
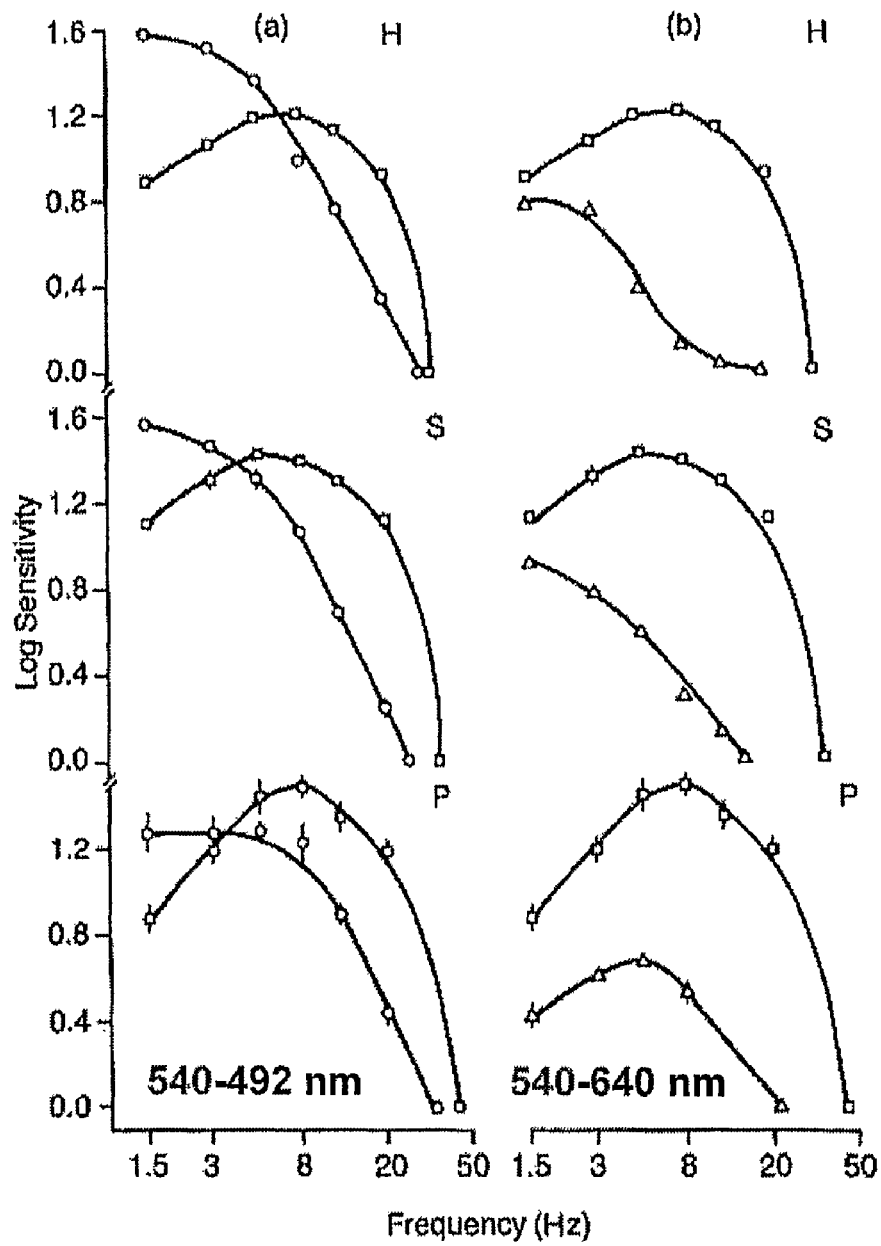
FIG. 4 is a set of graphs illustrating the temporal resolution of the HVS for time-varying modulation of luminance and chromaticity.
Figure 6A:
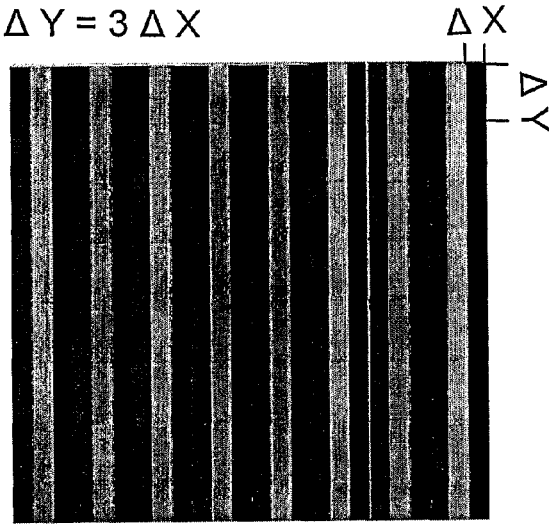
FIGS. 6A to 6C show respectively the RGB stripe pixel mosaic structure, the associated spatial Nyquist resolution limits and the associated fixed-pattern noise modulation spectrum.
Figure 6C:
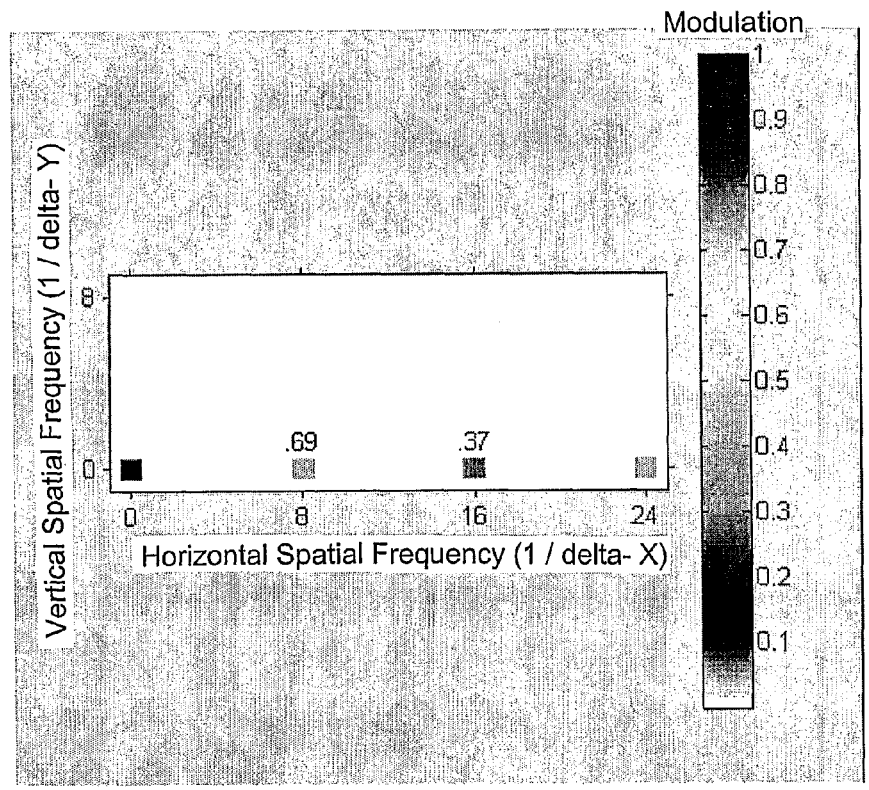
Figure 6B:
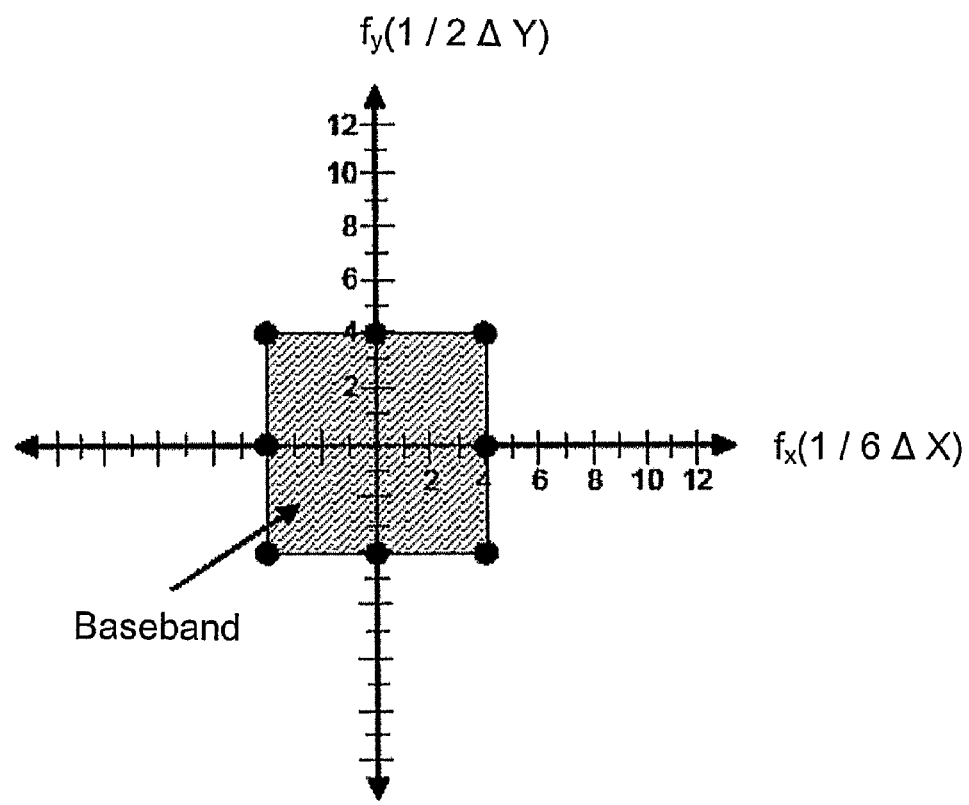
Figure 6D:
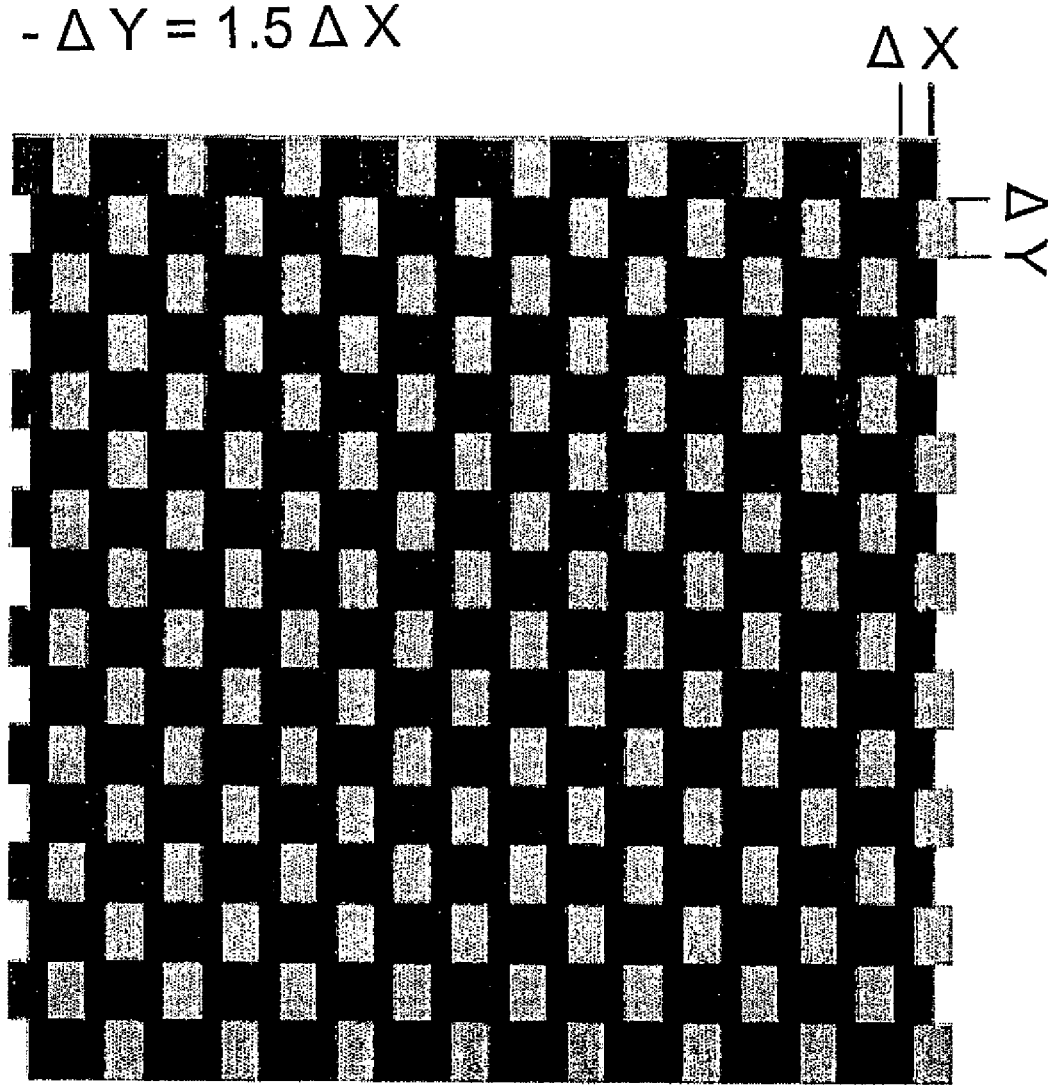
FIGS. 6D through 6F show respectively the RGB delta-triad pixel mosaic structure, the associated spatial Nyquist resolution limits and the associated fixed-pattern noise modulation spectrum.
Figure 6E:
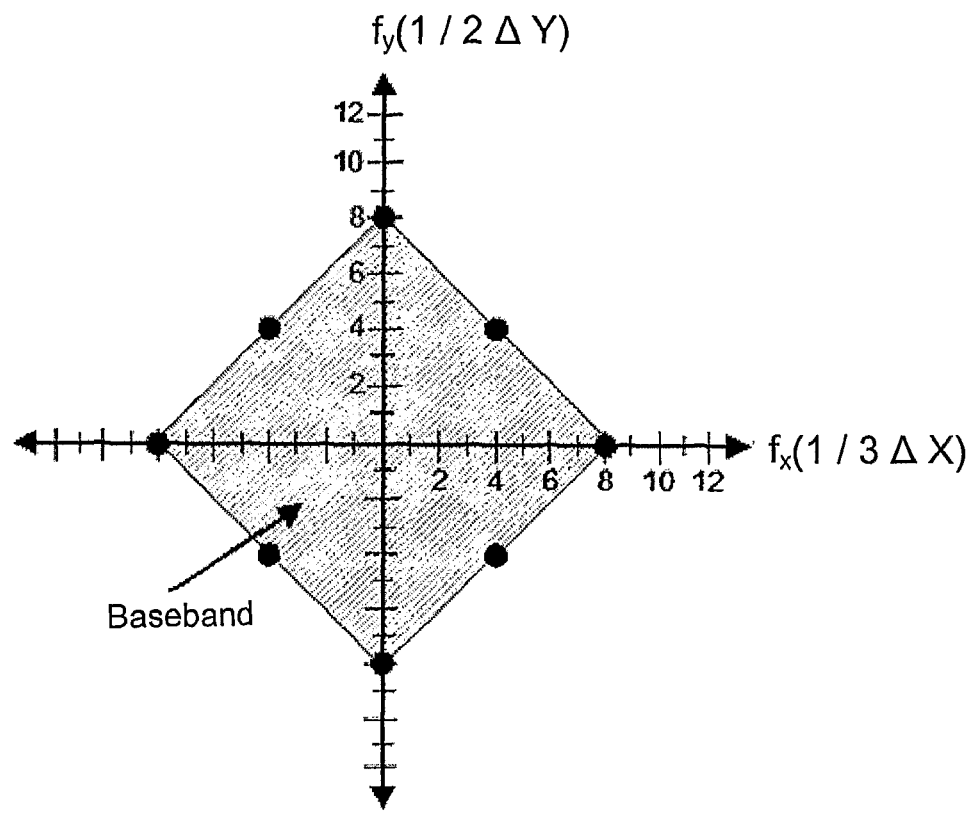
Figure 6F:
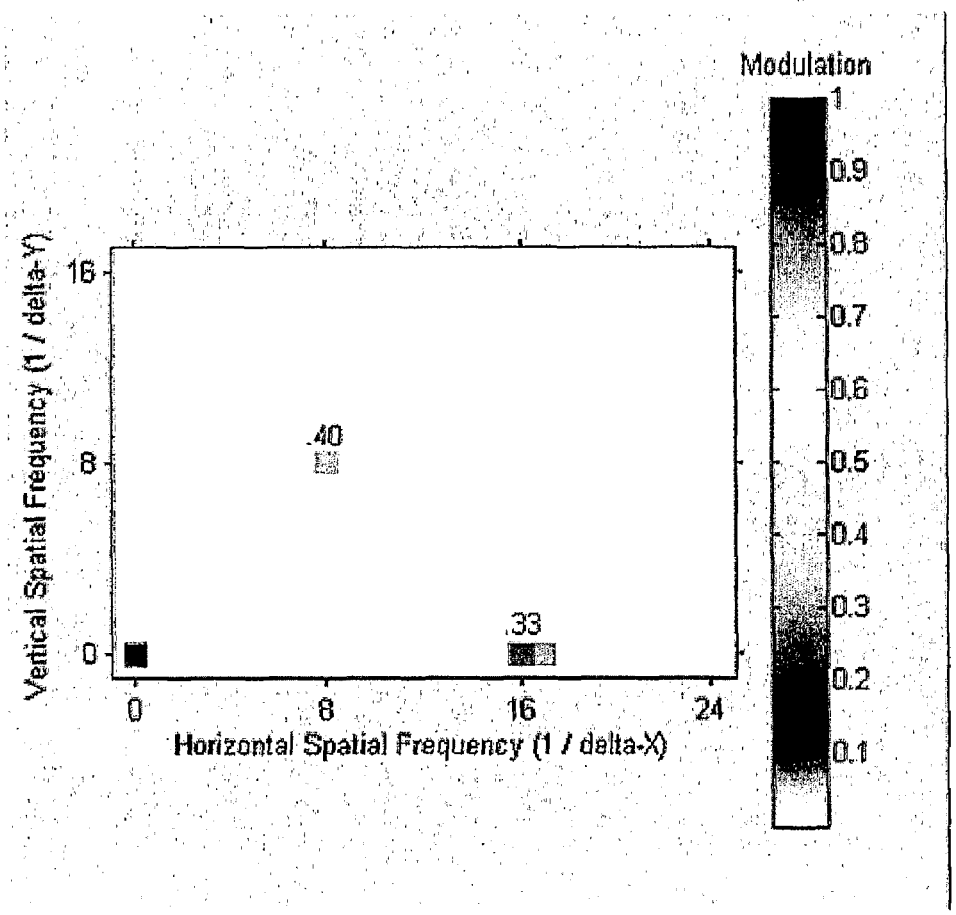

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Various colors are referred to herein by corresponding letters. In this description:
R means red;
G means green;
B means blue;
C means cyan;
M means magenta; and,
Y means yellow.

This invention provides displays that synthesize a color spectrum by combining X-Y spatial-additive color synthesis and z-axis superpositional color synthesis. The invention may be embodied in a wide range of display types including: direct-view, flat-panel type color matrix display devices; projection display systems; and near-to-eye, color imaging devices.

In illustrative embodiments, spatial color synthesis operative in an X-Y plane is combined with superpositional synthesis along a Z axis to provide full-color displays. In such embodiments, a two-color modulator (a "first" modulator) comprising a mosaic made up of sub-pixels of two colors provides a two-color image component in which the two colors of the sub-pixels are combined by spatial color synthesis. This image component may be called a "first" image component. The two-color image component is then superposed with a "second" image component to provide a full color image. The second image component is imagewise modulated by a second modulator. In preferred embodiments the superposition of the first and second image components is performed along a Z-axis.

The sub-pixels of the mosaic of the first modulator used to modulate the two-color first image component may be arranged in any suitable two-dimensional pattern. Simple, regular geometric patterns are preferred. Some example patterns are:
checkerboard patterns;
horizontal stripes;
vertical stripes;
staggered rows of alternating colored sub-pixels; and,
other two dimensional patterns.

In example embodiments described below the sub-pixels of the first modulator are arranged in two-dimensional checkerboard arrangements.

The second image component is imagewise modulated by controlling sub-pixels of a third color in the second modulator. The third color is different from the two colors of the first image component. In preferred embodiments the second image component is monochrome. The sub-pixels of the second modulator that modulate the second image component may be larger than the associated sub-pixels used for modulating the first image component. Hence light emitted from a single third-color sub-pixel may superposed with light from two or more sub-pixels of the first modulator that modulates the first image component.

In some embodiments the second modulator comprises a backlight comprising an array of addressable elements that emit light of the third color. The elements may each comprise:
light-emitting diodes (LEDs) or other lamps; or
light valves that modulate light from a common light source.

Each element of the backlight is individually addressable.

In some embodiments the first modulator is optically transparent to the light of the second image component. In such embodiments, the sub-pixels of the first modulator comprise independently-selectable emissive regions. Such sub-pixels may comprise organic light-emitting diodes (OLEDs) or other electroluminescent materials, for example.

A first group of the sub-pixels can emit light having a first spectral power distribution (SPD) a second group of the sub-pixels can emit light having a second SPD different from the first SPD. For example, the SPD of the first group of sub-pixels may correspond to green light while the SPD of the second group of sub-pixels corresponds to red light. The color sub-pixels of the first and second modulators may directly emit three primary colors. In the alternative, some or all of the sub-pixels may emit light that is not a primary color and the display may comprise color filters having spectral transmission functions (STFs) suitable for providing a desired color response.

Figure 7:
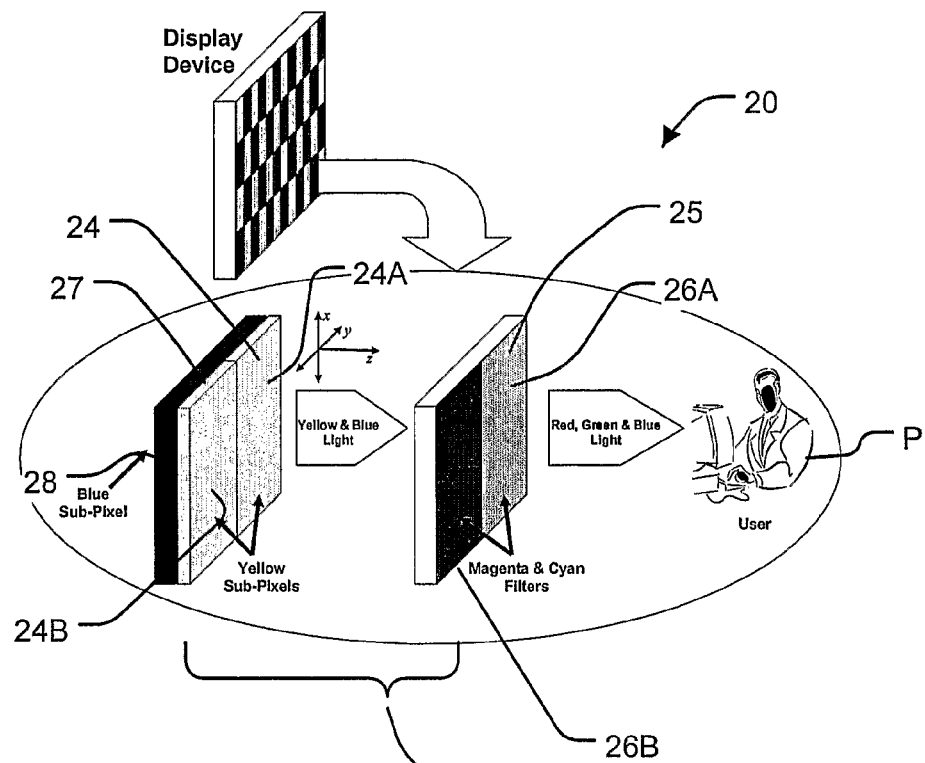
FIGS. 7 to 9 show self-luminous displays that have a filter layer.

FIG. 7 shows a display 20 according to one embodiment of the invention. Display 20 includes a first modulator 22 comprising a light-emitting layer 24 and a filter layer 25. Light-emitting layer 24 comprises an array of yellow-emitting sub-pixels. Filter layer 25 comprises a mosaic of magenta filters 25A and cyan filters 25B. The filters are arranged in a checkerboard pattern. Each magenta filter 25A of layer 25 is aligned with a corresponding yellow light emitter 24A. Each cyan filter 25B is aligned with a corresponding yellow light emitter 24B.

Magenta filters 25A can be conceptualized as having both R and B spectral passbands. Cyan filters 25B can be conceptualized as having both G and B spectral passbands. Yellow light sources 24A and 24B can be considered to produce light that is a composite of R and G SPDs.

Display 20 comprises a second modulator 27. Second modulator 27 comprises an array of addressable sub-pixels 28 each sub-pixel comprises a source of blue light (e.g. having a SPD generally confined to shorter visible wavelengths). First modulator 22 is substantially transparent to the blue light from second modulator 27 (layer 24 is substantially transparent to blue light and both C and M filters have passbands that pass blue light).

Display 20 performs color synthesis as follows. When a yellow light source 24A is turned on, it emits yellow light which can be considered to be a combination of red and green light. The yellow light passes through the corresponding magenta filter 25A which blocks the green component of the yellow light to leave red light. When a yellow light source 24B is turned on, it emits yellow light which passes through the corresponding cyan filter 25B which blocks the red component of the yellow light to leave green light. If all of the Y sub-pixels of layer 24 are activated, the interaction of the Y SPD (i.e., R+G) with the M (R+B) and C (G+B) color filters of layer 25 results in a checkerboard pattern of R and G sub-pixels.

Blue light from light sources 28 of second modulator 27 can pass through layers 24 and 25 to provide a blue image component. If all of blue light sources 28 are turned on then the interaction of the B SPD with the M (R+B) and C (G+B) color filters results in a homogeneous blue color.

Since the light emitted by blue light emitters 28 is not affected significantly by first modulator 22 then it would be possible to change the location of blue light emitters 28. For example, blue light emitters 28 could be:

in substantially the same plane as yellow light emitters 24A and 24B;
between layers 24 and 25 (as long as any layer containing blue light emitters 28 is substantially transparent to yellow light); or
in front of layer 25 (as long as any layer containing blue light emitters 28 is substantially transparent to red and green light).

There is some advantage to providing blue light emitters 28 behind layers 24 and 25 since any spreading or diffusion of light from blue light emitters 28 tends to be less noticeable than spreading or diffusion of light of other colors (because of the reduced spatial resolution of the HVS for light of shorter wavelengths). There is some advantage to having filter layer 25 be an outside or topmost layer since filter layer 25 can serve to enhance contrast by reducing the effects of reflected ambient illumination.

Display 20 can display full color images to an observer P by selectively activating sub-pixels 24A, 24B and 28 of each pixel of display 20 in suitable combinations. The particular combination of illuminant SPDs and color filter STFs of display 20 has particular functional advantages which derive from HVS characteristics. Displays according to the invention can have many other configurations, some of which are described below.

Figure 8:
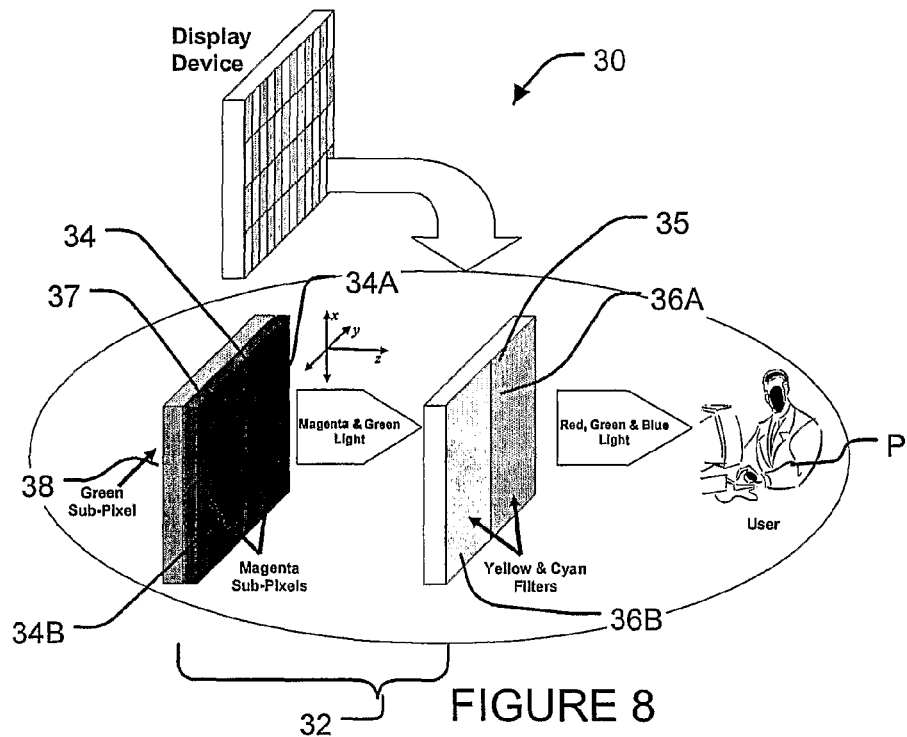

FIG. 8 shows a display 30 according to another embodiment of the invention. Display 30 is similar to display 20 and has a first modulator 32 comprising a light source layer 34 and a filter layer 35. A difference between display 30 and display 20 is the SPFs of the light sources and the STFs of the filters. In display 30 filter layer 35 comprises a checkerboard pattern of Y and C color filters 35A and 35B. Y filters 35A can be conceptualized as passing light in R and G spectral passbands. C filters 35B can be conceptualized as passing light in G and B spectral passbands.

The independently-selectable light sources 34A and 34B of each sub-pixel of first modulator 32 emit light having a SPD corresponding to the color magenta. The SPD of the M source can be considered as combining R and B SPDs.

When a magenta light source 34A is turned on, it emits magenta light which passes through the corresponding yellow filter 35A which blocks the blue component of the yellow light to leave red light. When a magenta light source 34B is turned on, it emits magenta light which passes through the corresponding cyan filter 35B which blocks the red component of the magenta light to leave blue light.

Light sources 38 of second modulator 37 emit green light (e.g. these light sources have a SPD concentrated in wavelengths in the middle of the visible light range). Green light from light sources 38 of second modulator 37 can pass through layers 34 and 35 to provide a green image component.

Figure 9:
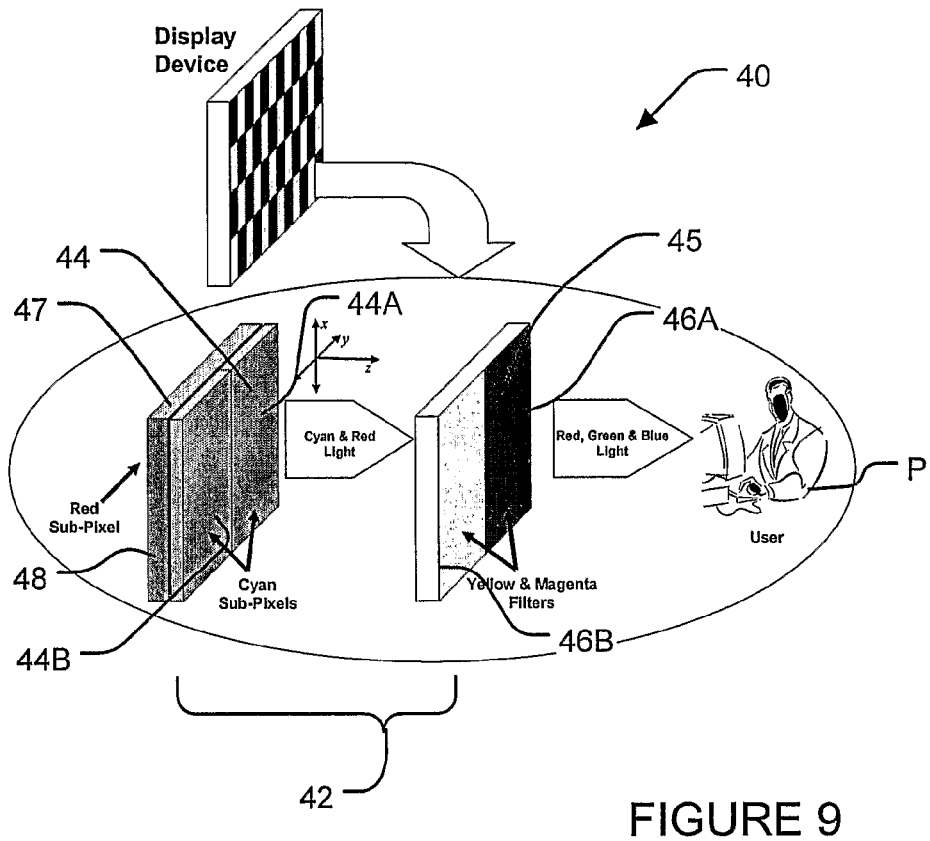

FIG. 9 shows a display 40 that is similar to displays 20 and 30 except for the SPFs of the light sources and the STFs of the filters. Display 40 has a first modulator 42 comprising a light source layer 44 and a filter layer 45. Filter layer 45 comprises a checkerboard pattern of Y and M filters 45A and 45B. The light sources 44A and 44B of light source layer 44 emit cyan light.

When a cyan light source 44A is turned on, it emits cyan light which passes through the corresponding yellow filter 45A. The filter 45A blocks the blue component of the cyan light to leave green light. When a cyan light source 34B is turned on, it emits cyan light which passes through the corresponding magenta filter 45B which blocks the green component of the cyan light to leave blue light.

Light sources 48 of second modulator 47 emit red light (e.g. these light sources have a SPD concentrated in longer wavelengths of the visible light range). Red light from light sources 48 of second modulator 47 can pass through layers 44 and 45 to provide a red image component.

Figure 10:
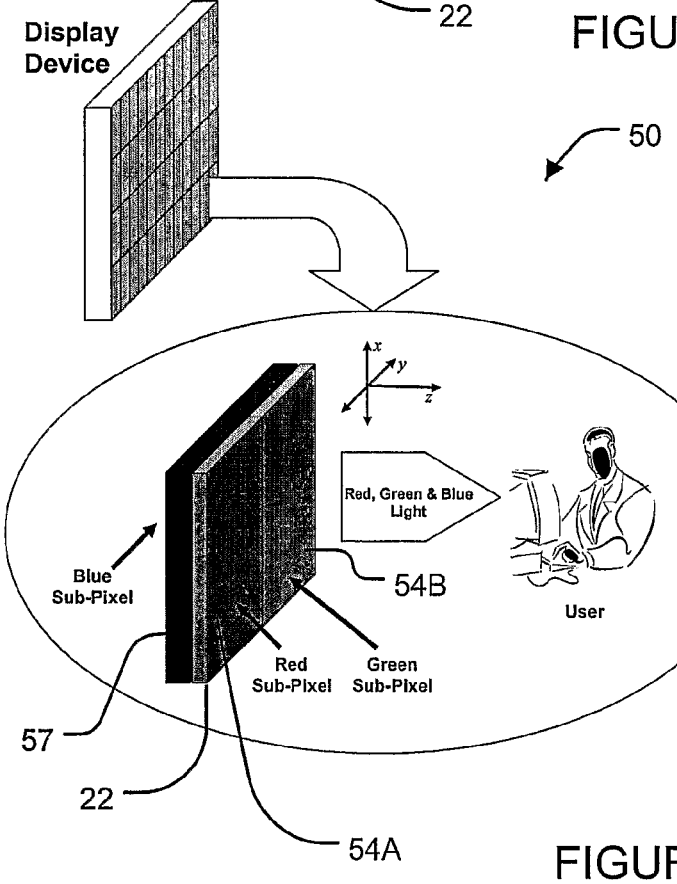
FIGS. 10 to 12 show self-luminous displays in which light emitters directly emit light of primary colors.
Figure 11:
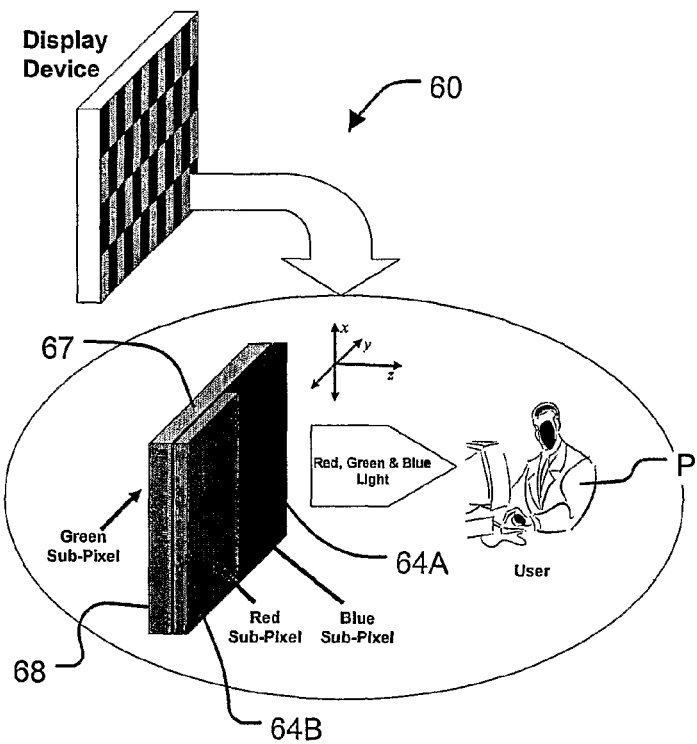
Figure 12:
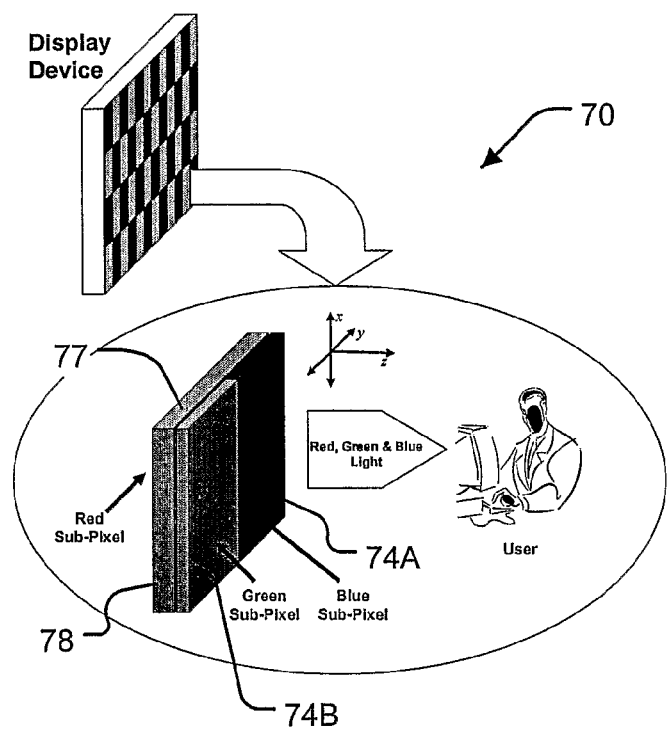

FIGS. 10, 11, and 12 show displays that are analogous to the displays of FIGS. 7, 8, and 9 respectively. In the displays shown in these Figures, all of the light emitters of the first and second modulators directly emit primary colors of light. Hence, these displays do not require a filter layer to generate primary colors. A trade-off is that the first modulator of these displays has sub-pixels of two different colors. In designing a display for a particular application one should also consider the required brightness of the display. While color filters will absorb some portion of the light generated by the sub-pixel emitters, for many types of emissive display materials a SPD with a broader spectral band (e.g. a Y emitter) provides a substantially higher luminous efficacy than the sum of narrow-band components (e.g. the combination of R and G emitters).

FIG. 10 shows a display 50 having a first modulator 52 and a second modulator 57. First modulator 52 comprises a mosaic made up of addressable light emitters 54A that emit light of a first color, in this case red and addressable light emitters 54B that emit light of a second color, in this case green. Second modulator 57 comprises an array of light emitters 58 that emit light of a third color, in this case blue. Blue light from second modulator 57 can pass through first modulator 52 to superpose with a red and green image component made up of light emitted by the light sources of first modulator 52. In the alternative, display 50 may be constructed so that red and green light from a red and green image component made up of light emitted by the light sources of first modulator 52 passes through second modulator 57 and is superposed with a blue image component made up of light emitted by the light sources of second modulator 57 from the vantage point of a viewer P.

FIGS. 11 and 12 show displays 60 and 70 that are the same as display 50 except for the colors of light emitted by the different light emitters. In display 60, first modulator 62 comprises a mosaic of red and blue light emitters 64A and 64B while second modulator 67 comprises an array of green light emitters. In display 70, first modulator 72 comprises a mosaic of green and blue light emitters 74A and 74B while second modulator 77 comprises an array of red light emitters 78.

Other implementations can exploit the low spatial resolution of the HVS for chromatic channels, especially at the blue end of the spectrum. The poor visual acuity of the HVS in the blue chromatic channel implies that sub-pixels emitting in this channel can be larger with no perceived loss of resolution or color synthesis performance. In other words, a blue image component can have a significantly lower spatial resolution than other image components without noticeably degrading image quality.

Figure 13:
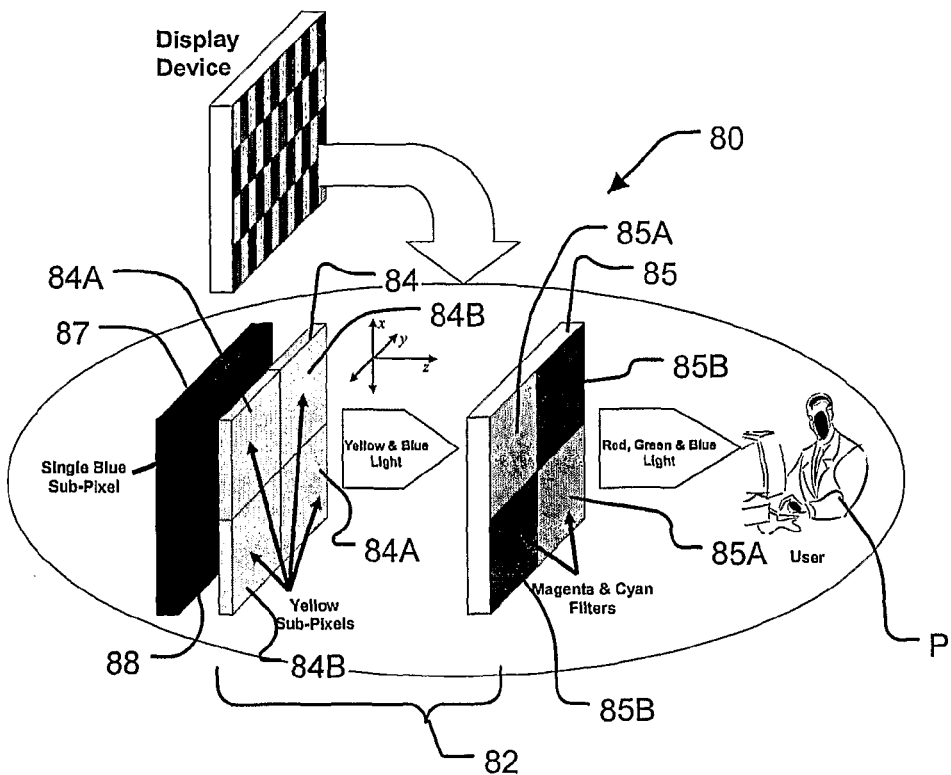
FIGS. 13 and 14 show self-luminous displays in which a modulator that images a blue image component has a resolution lower than a modulator producing red and green image components.

FIG. 13 shows a display 80 in which a first modulator 82 comprises a light-emitting layer 84 comprising light-emitters 84A and 84B and a filter layer 85 comprising filters 85A and 85B. Display 80 comprises a second modulator 87 comprising addressable light-emitters 88 that emit blue light. Display 80 is similar to display 20 (FIG. 7) except that each addressable light-emitter 88 corresponds with multiple (in this example, two) pairs of sub-pixels of first modulator 82.

Figure 14:
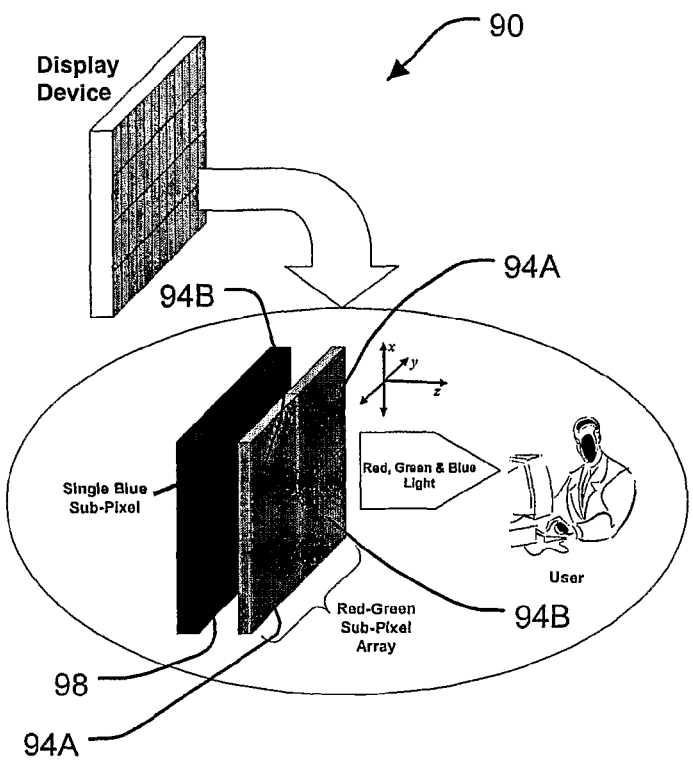

FIG. 14 shows a display 90 similar to display 50 (FIG. 10) utilizing red, green and blue emitters. In display 90 each addressable light-emitter 98 of second modulator 97 corresponds with multiple (in this example, two) pairs of sub-pixels 94A and 94B of first modulator 92.

Figure 15:
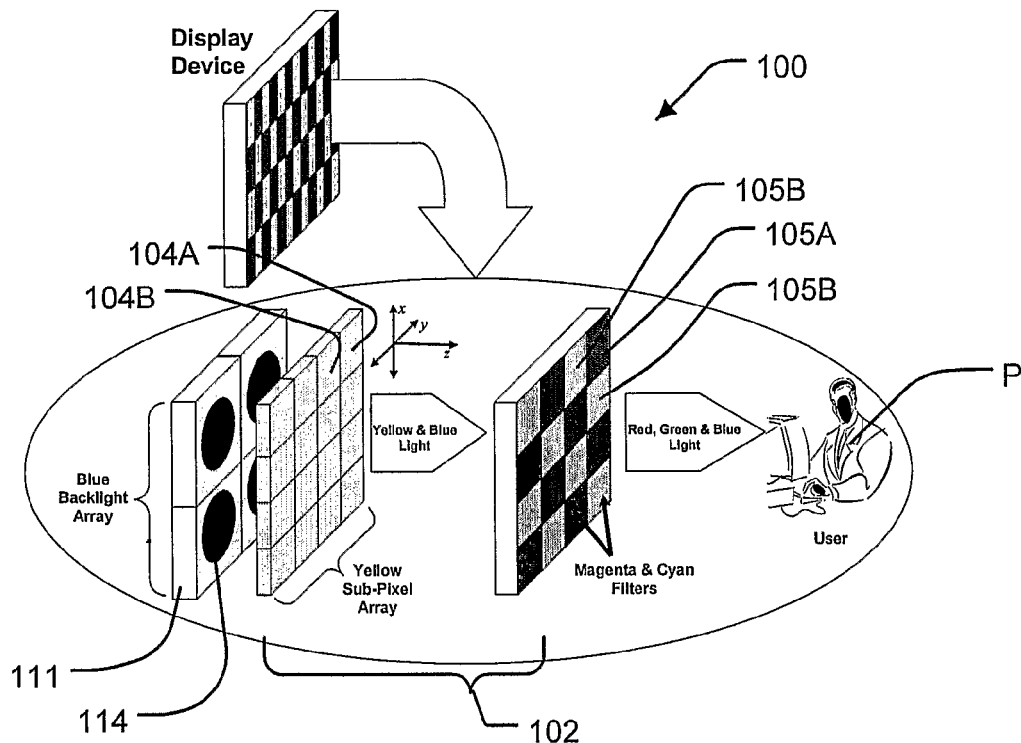
FIGS. 15 and 16 show displays which each comprise a separate addressable backlight assembly.
Figure 16:
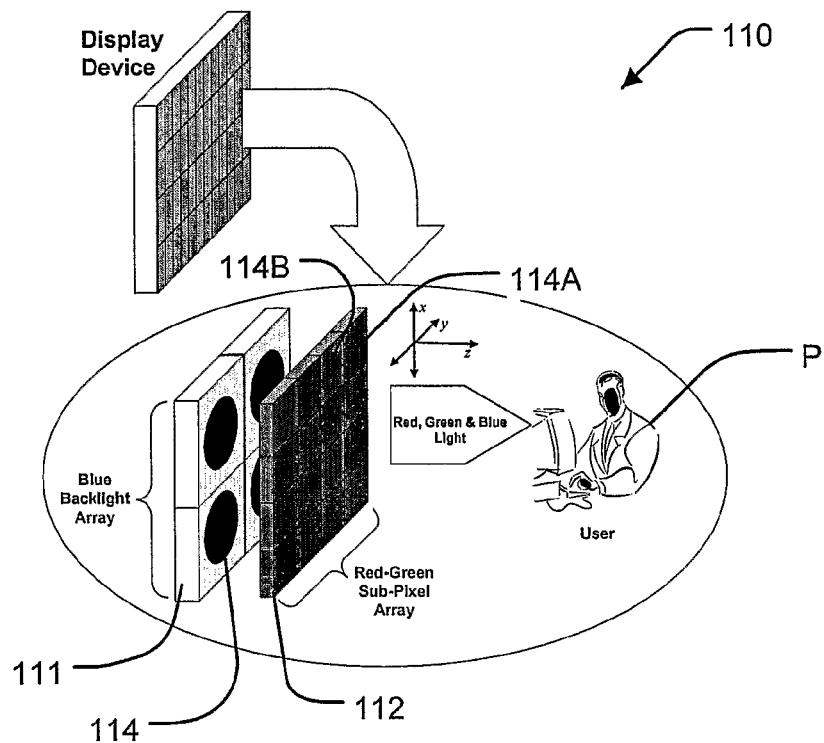

Chromatic channel emitters may be provided in a separate assembly without adversely affecting perceived image quality due to the poor visual acuity of the HVS in the chromatic channel. For example, FIGS. 15 and 16 show displays 100 and 110 respectively which each comprise a separate addressable backlight assembly 111 comprising a plurality of individually-addressable blue light sources 114 (the blue light sources could be, for example, blue LEDs). Light from each blue light source 14 is superposed with light from multiple (two or more) sub-pixels of a first modulator. In display 100 first modulator 102 has sub pixels that each comprise a yellow light source 104A or 104B that illuminates either a magenta filter 105A or a cyan filter 105B. In display 110 first modulator 112 has sub pixels that comprise either a red light source 114A or a green light source 114B.

The poor visual acuity of the HVS in the blue and the fact that each blue emitter corresponds to multiple M-C or R-G sub-pixels also eases alignment tolerances between backlight 111 and the first modulator 102 or 112.

Figure 17:
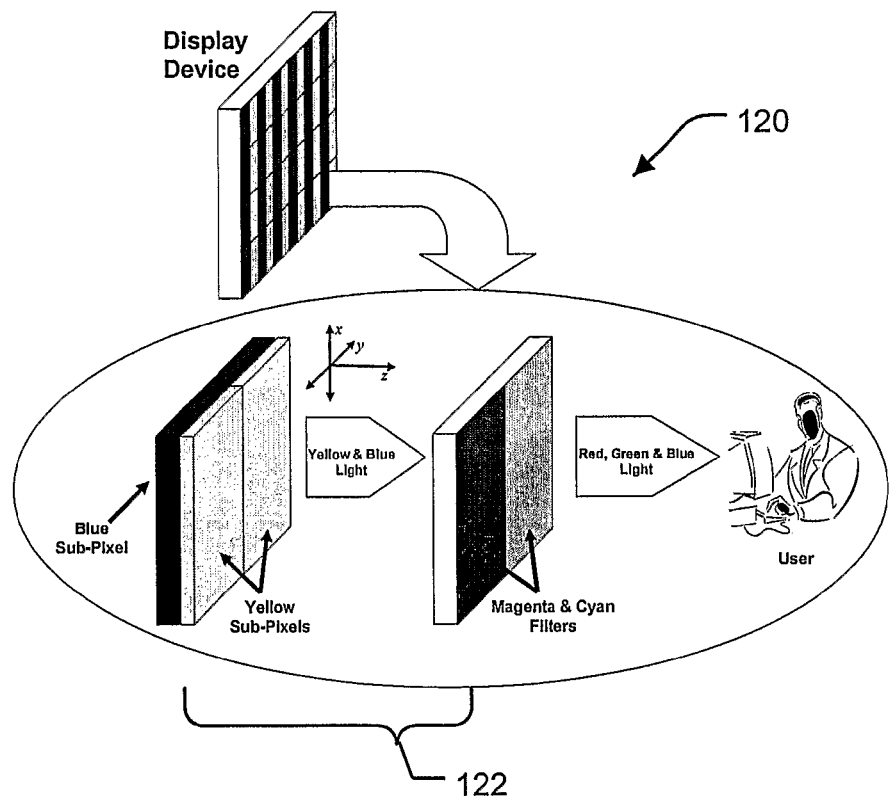
FIGS. 17 and 18 show displays in which the sub-pixels of a first modulator are arranged as vertical stripe arrays.
Figure 18:
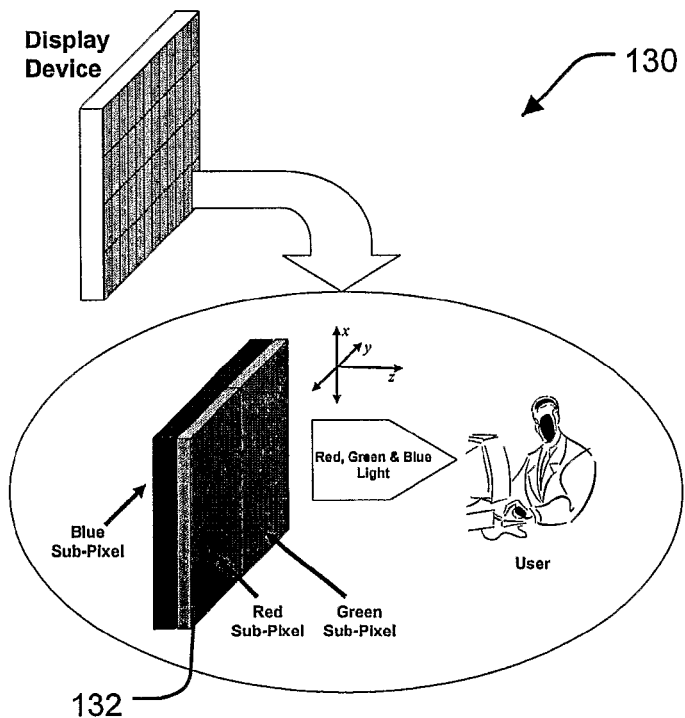

As noted above, the sub-pixels of the first modulator may be arranged in patterns other than the checkerboard pattern. For example, FIGS. 17 and 18 respectively show displays 120 and 130 in which the sub-pixels of the first modulator 122 and 132 are arranged as vertical stripe arrays.

Figure 19:
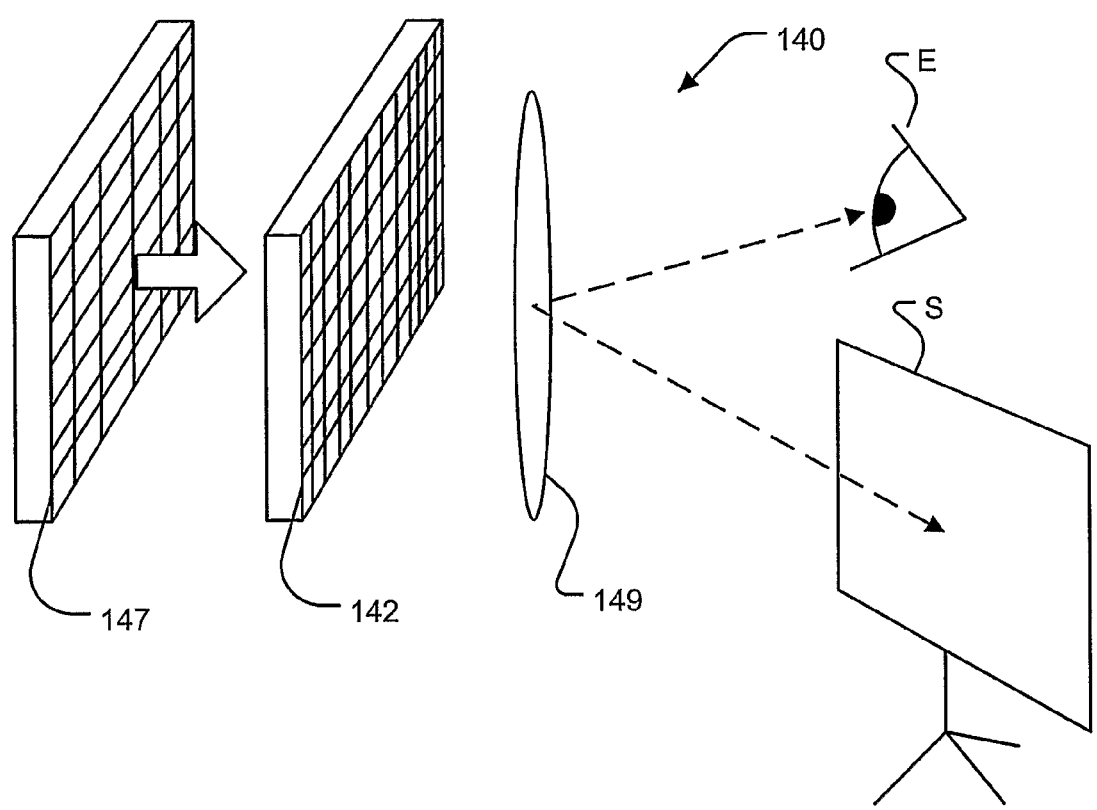
FIG. 19 shows a display having an optical system for color projection or near-to-eye viewing.

FIG. 19 shows a display 140 which includes an optical system 149. Optical system 149 projects superposed image components from first modulator 142 and second modulator 147 onto a screen S or, in the alternative, forms a virtual image of the superposed image components that can be seen by a user's eye E in a near-to-eye display. Any combination of first and second modulators as described herein may be used in display 140. First modulator 142 may comprise emitters of light having two different SPDs or may comprise emitters that emit light having the same SPD combined with filters that have different STFs as described herein. Second modulator 147 may comprise a backlight made up of separate light sources or a layer having an array of light sources disposed thereon, or the like.

Figures 20A, 20B:
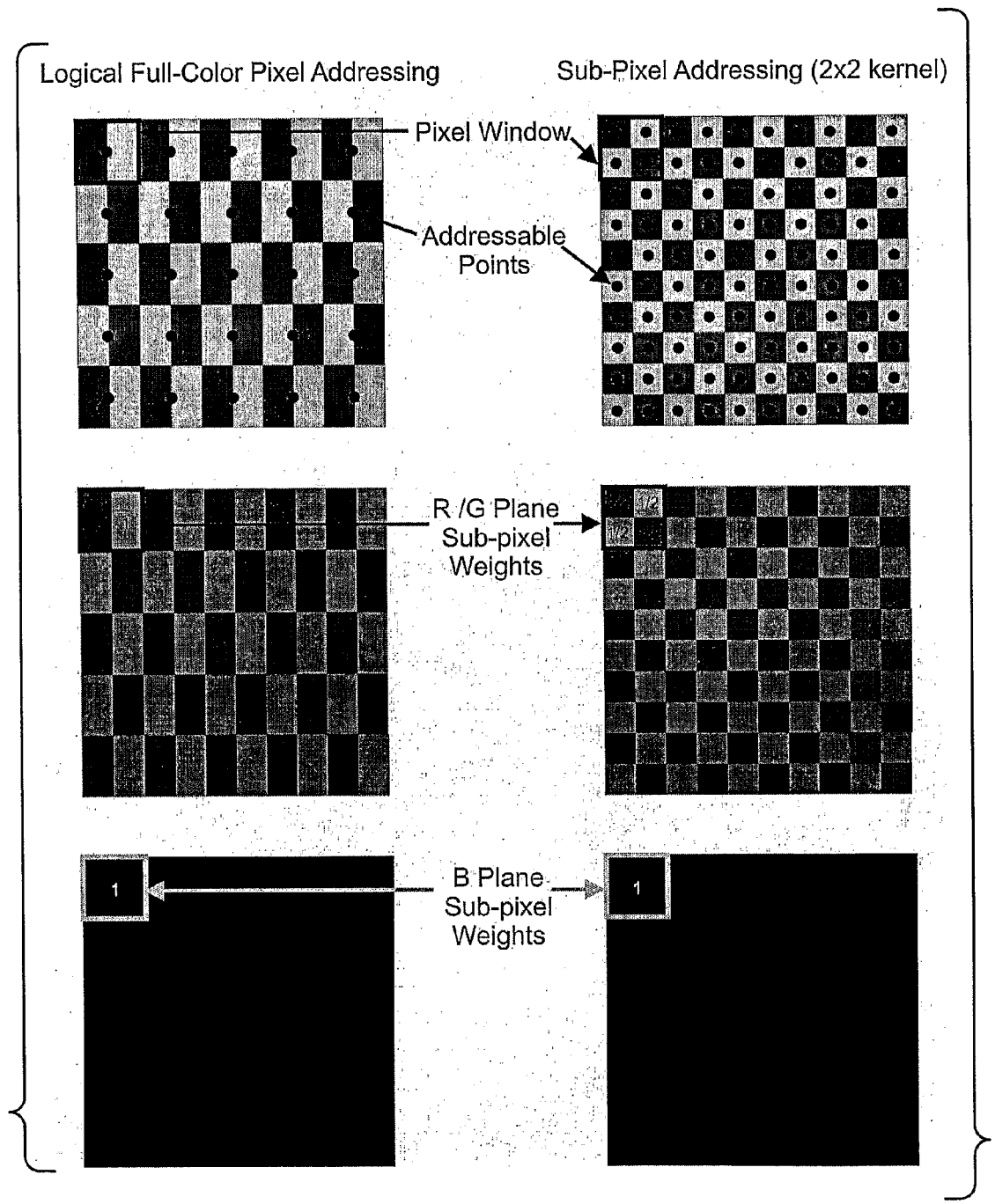
FIGS. 20A and 20B show two different modes of addressing pixels of a display according to the invention.

FIGS. 20A and 20B show two different modes of addressing pixels of a display according to the invention. FIG. 20A shows the addressable pixel locations, the pixel window and the sub-pixel weights for the R/G and B planes according to a logical, full-color pixel mode. FIG. 20B shows the addressable pixel locations, the pixel window and the sub-pixel weights for the R/G and B planes according to a sub-pixel addressing mode using a 2×2 spatial filter kernel.

Figure 21A:
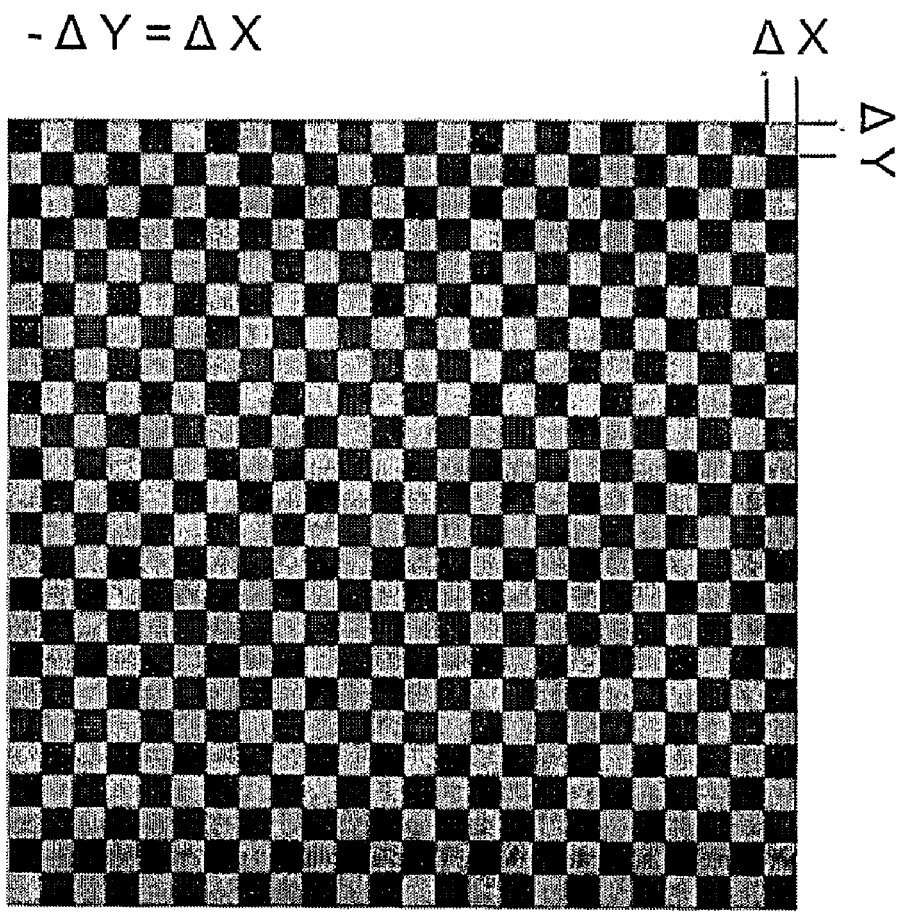
FIGS. 21A, 21B and 21C respectively show a M/C X-Y spatial pixel mosaic structure for a display according to an embodiment of the invention with associated spatial Nyquist resolution limits and associated fixed-pattern noise modulation spectrum.
Figure 21B:
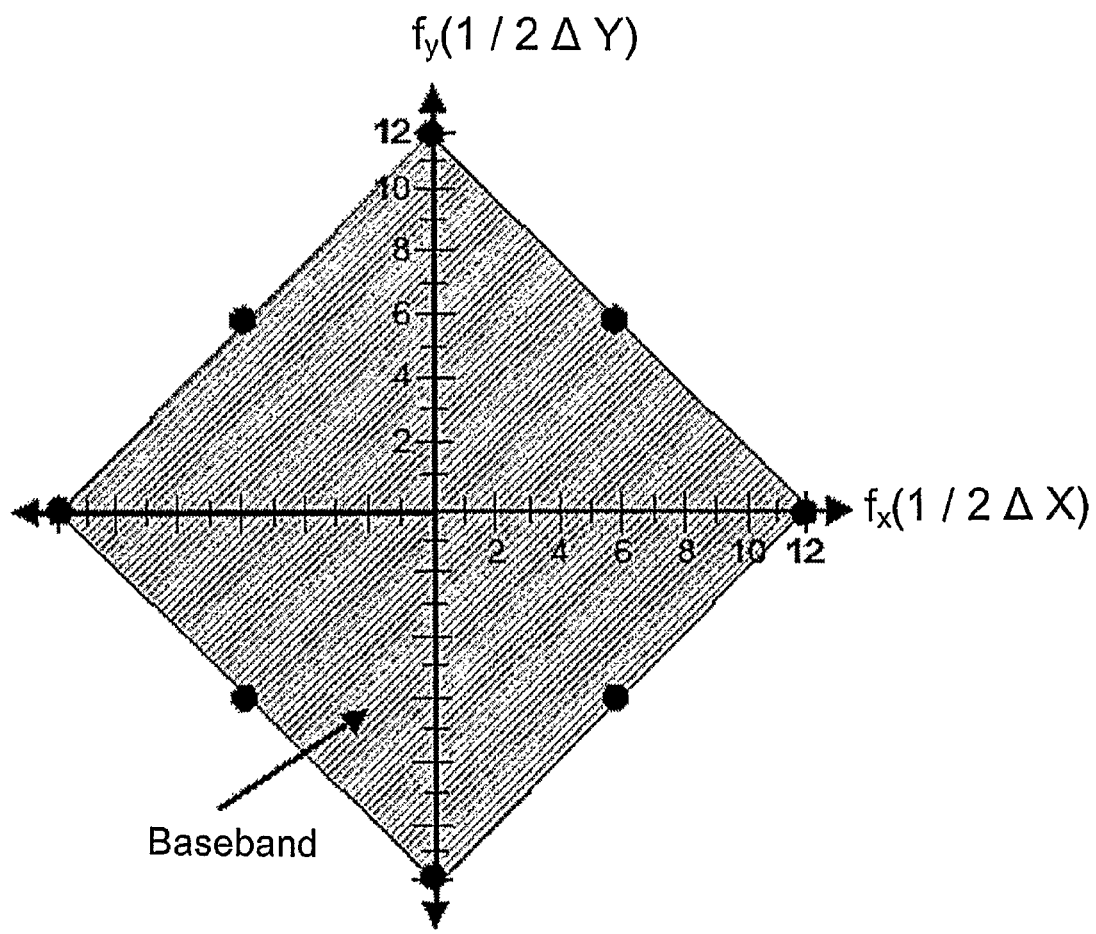
Figure 21C:
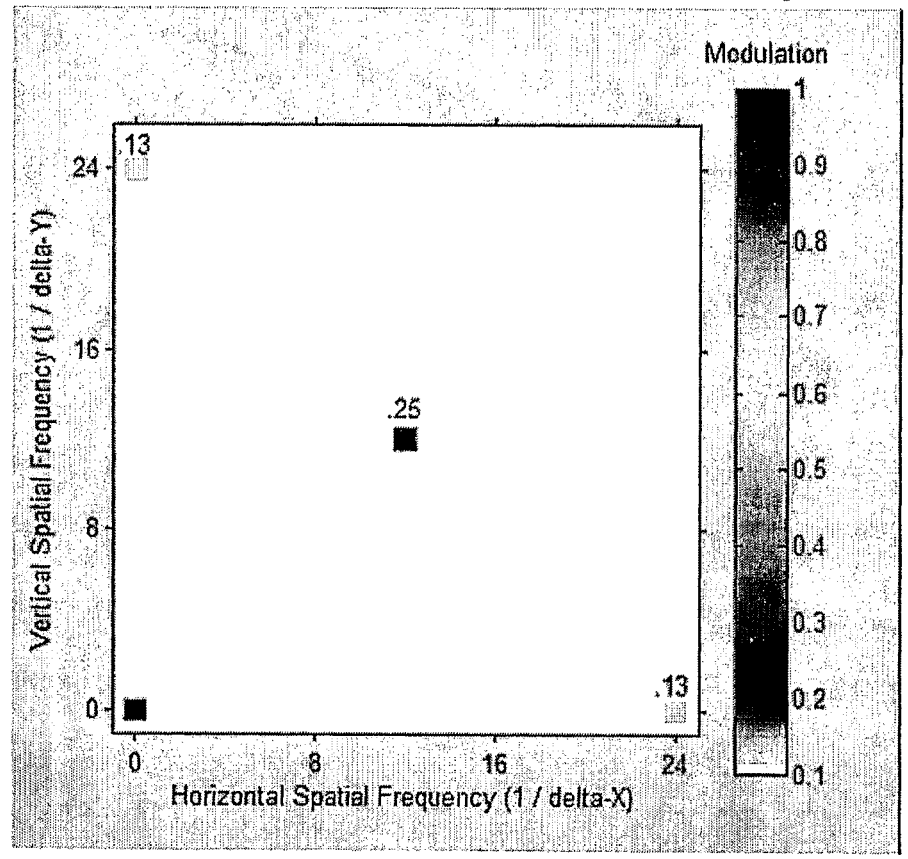

FIGS. 21A, 21B and 21C show respectively a M/C X-Y spatial pixel mosaic structure for a first modulator in a display according to an embodiment of the invention with associated spatial Nyquist resolution limits and associated fixed-pattern noise modulation spectrum. In this example embodiment, the first modulator has a checkerboard pattern.

Images may be optimized for display on displays of the types described herein by way of optimized sub-pixel processing and anti-aliasing by a small spatial filter kernel tuned to a regular and continuous, two-dimensional checkerboard pixel mosaic resulting from the spatial pattern of color sub-pixels in the X-Y plane in combination with the spectral contributions of the Z-axis superpositional component.

It can be appreciated that displays as described herein may be constructed for a wide range of applications including full-color alphanumeric displays, graphic displays and/or displays for television-type video images.

While a number of exemplary aspects and embodiments have been discussed above, those of skill in the art will recognize certain modifications, permutations, additions and sub-combinations thereof. For example:

Since the human visual system possesses low luminous efficacy and limited resolution in both the spatial and temporal domains for short wavelength inputs, system bandwidth could be conserved by refreshing a separated short-wavelength input (for example an input controlling sub-pixels that emit blue light) at a lower rate than sub-pixels that control light of longer wavelengths. This could be accomplished in an embodiment in which a second modulator comprises a plane of blue sub-pixels or a blue backlight. A temporal frequency of ½ that of the more sensitive visual components (e.g. red/green) may be used, for example.

In the embodiments described above, two arrays of light-emitters are superimposed so that the image components arising from the arrays are superposed as seen by a viewer. The light emitting arrays do not themselves need to be superimposed. The superposition could be performed by an optical system, such as the optical system of a projection display.

Filters (such as filters 25A and 25B in the embodiment of FIG. 7) may optionally comprise individually-addressable light valves, such as liquid crystal light valves. The light valves may be controlled to increase dynamic range of the display. For example, when it is desired that a pixel be black the light valves may be turned off.

Some of the accompanying drawings show first modulators having separate light-emitting and filter layers. These layers are shown as being spaced apart in the Z-axis direction for clarity. However, this is not necessary. The layers may be directly adjacent to one another.

The various layers of light emitters and filters may be arranged on suitable substrates in various ways. For example, in some embodiments, light emitters of the first and second modulators are patterned on opposing sides of a substrate that is substantially transparent to the light in the image component produced by either or both of the first and second modulators.

The light output of the light emitters described herein may be variable continuously or in any suitable number of steps in response to image data.

Typically, the light-emitting elements and any other controllable elements of displays according to any of the embodiments described herein will be driven by suitable driving circuits and controlled by a controller in response to image data received at the controller. The construction of suitable driving circuits and suitable architectures for display controllers are known to those skilled in the art and are therefore not described herein.

It is therefore intended that the following appended claims and claims hereafter introduced are interpreted to include all such modifications, permutations, additions and sub-combinations as are within their true spirit and scope.

What is claimed is:

1. A color display comprising:
    a first plane comprising an array of individually-addressable first light emitters, the first light emitters each capable of emitting light having a first spectral power distribution;
    a second plane comprising an array of individually-addressable second light emitters and individually-addressable third light emitters, the second light emitters each capable of emitting light having a second spectral power distribution and the third light emitters each capable of emitting light having a third spectral power distribution, the second plane being substantially adjacent to and parallel to the first plane;
    wherein the first, second and third spectral power distributions are different from one another and wherein either the second plane is substantially transparent to light emitted by the first plane and the second and third light emitters comprise electroluminescent light sources or the first plane is substantially transparent to light emitted by the second plane and the first light emitters comprise electroluminescent light sources.

2. A color display according to claim 1 wherein each of the first light emitters is aligned to illuminate a plurality of light emitters of the second plane.

3. A color display according to claim 2 wherein each of the first light emitters is aligned to illuminate one of the second light emitters and one of the third light emitters.

4. A color display according to claim 1, wherein the second light emitters each comprise a second light source capable of emitting light comprising a plurality of spectral components and a second filter, the second filter passing light from the first light emitter, passing at least a first one of the spectral components of the second light source and blocking at least a second one of the spectral components of the second light source.

5. A color display according to claim 4 wherein the third light emitters each comprise a third light source capable of emitting light comprising a plurality of spectral components and a third filter, the third filter passing light from the first light emitter and passing at least a first one of the spectral components of the third light source and blocking at least a second one of the spectral components of the third light source.

6. A color display according to claim 5 wherein the second filter has a transmission characteristic that substantially blocks the first one of the spectral components of the third light source.

7. A color display according to claim 6 wherein the third filter has a transmission characteristic that substantially blocks the first one of the spectral components of the second light source.

8. A color display according to claim 5 wherein the second light sources emit light having a spectral power distribution substantially the same as a spectral power distribution of the third light sources.

9. A color display according to claim 8 wherein the second and third light sources each emit yellow light.

10. A color display according to claim 9 wherein the second filter is a cyan filter and the third filter is a magenta filter.

11. A color display according to claim 8 wherein the second and third light sources each emit magenta light.

12. A color display according to claim 11 wherein the second filter is a cyan filter and the third filter is a yellow filter.

13. A color display according to claim 8 wherein the second and third light sources each emit cyan light.

14. A color display according to claim 13 wherein the second filter is a yellow filter and the third filter is a magenta filter.

15. A color display according to claim 5 wherein the second and third filters each comprise an individually-addressable light valve element.

16. A color display according to claim 5 comprising a plane comprising an array of individually-addressable light valves, each of the light valves aligned with one or more of the second and third light emitters of the second plane.

17. A color display according to claim 1 wherein the spectral power distribution of the first light emitters is biased toward shorter wavelengths as compared to spectral power distributions of the second or third light emitters.

18. A color display according to claim 1 wherein the spectral power distribution of the first light emitters is primarily made up of wavelengths between wavelengths of the spectral power distributions of the second or third light emitters.

19. A color display according to claim 1 wherein the spectral power distribution of the first light emitters is biased toward long wavelengths as compared to spectral power distributions of the second or third light emitters.

20. A color display according to claim 1 wherein the first, second and third light emitters each emit a different one of blue light, green light and red light.

21. A color display according to claim 1 wherein the first plane comprises a backlight comprising a plurality of discrete light emitters.

22. A color display according to claim 1 wherein the second and third light emitters are arranged in a mosaic made up of alternating stripes of the second and third light emitters extending across one dimension of the display.

23. A color display according to claim 1 wherein the second and third light emitters are arranged in a mosaic made up of a checkerboard pattern of second and third emitters.

24. A color display according to claim 1 wherein the display serves as both an illumination source and an image-forming source in a projection optical system.

25. A color display comprising:
   a first light modulator comprising a matrix of individually-addressable first and second light emitters, the first and second light emitters respectively being capable of emitting light having first and second spectral power distributions to yield a first image component;
   a second light modulator comprising an array of individually-addressable sub-pixels each comprising an electroluminescent light source capable of emitting light having a third spectral power distribution different from the first and second spectral power distributions to yield a second image component;
   wherein the first light modulator is substantially transparent to the second image component and the first and second light modulators are arranged to permit the second image component to pass through all or part of the first light modulator to become superposed with the first image component to yield a color image.

26. A color display according to claim 25 wherein the sub-pixels of the second light modulator each emit blue light when actuated.

27. A method for displaying full color images, the method comprising:
   controlling pixels of a first light modulator to generate a first image component comprising a pattern of light issuing from the first light modulator;
   controlling sub-pixels of a second light modulator to generate a second image component comprising a pattern of light issuing from the second light modulator; and,
   allowing the light of the second image component to pass through the first light modulator to be superposed with the light of the first image component;
   wherein the sub-pixels of the first light modulator comprise electroluminescent light sources and one of the first and second image components comprises a monochrome image component and the other one of the first and second image components comprises at least two colors.

28. A method according to claim 27 wherein the second image component is the monochrome image component.

29. A method according to claim 27 wherein the light of the second image component is primarily blue light.

30. A method according to claim 29 wherein the first image component has a spatial resolution that is greater than a spatial resolution of the second image component.

31. A method according to claim 29 comprising refreshing the first image component at a first rate and refreshing the second image component at a second rate that is lower than the first rate.

32. A method according to claim 31 wherein the second rate does not exceed ½ of the first rate.

33. A color display comprising:
   a first plane comprising an array of individually-addressable first light emitters, the first light emitters each capable of generating light having a first spectral power distribution;
   a second plane comprising an array of individually-addressable second light emitters each capable of emitting light having a second spectral power distribution and the second plane being substantially adjacent to and parallel to the first plane;
   wherein the first and second spectral power distributions are different from one another, and wherein the first plane is substantially transparent to light emitted by the second plane.

34. A color display according to claim 33 wherein one of the first and second planes comprises an array of individually-addressable third light emitters each capable of emitting light having a third spectral power distribution, and wherein the third spectral power distribution is different from the first and second spectral power distributions.

* * * * *